(12) United States Patent
Lin et al.

(10) Patent No.: US 11,450,563 B2
(45) Date of Patent: Sep. 20, 2022

(54) INTERCONNECT STRUCTURE AND METHOD

(71) Applicant: Taiwan Semiconductor Manufacturing Co., Ltd., Hsinchu (TW)

(72) Inventors: Bo-Jiun Lin, Jhubei (TW); Yu Chao Lin, Hsinchu (TW); Tung Ying Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/039,390

(22) Filed: Sep. 30, 2020

(65) Prior Publication Data

US 2021/0343588 A1 Nov. 4, 2021

Related U.S. Application Data

(60) Provisional application No. 63/017,028, filed on Apr. 29, 2020.

(51) Int. Cl.
*H01L 21/768* (2006.01)
*H01L 23/522* (2006.01)
*H01L 23/532* (2006.01)

(52) U.S. Cl.
CPC .... *H01L 21/76843* (2013.01); *H01L 21/7684* (2013.01); *H01L 21/76802* (2013.01); *H01L 21/76874* (2013.01); *H01L 21/76877* (2013.01); *H01L 23/5226* (2013.01); *H01L 23/53238* (2013.01)

(58) Field of Classification Search
CPC ......... H01L 21/76843; H01L 21/76802; H01L 21/7684; H01L 21/76874; H01L 21/76877; H01L 23/5226; H01L 23/53238; H01L 21/76852; H01L 21/76885

See application file for complete search history.

(56) References Cited

U.S. PATENT DOCUMENTS

| | | | |
|---|---|---|---|
| 5,674,787 A | 10/1997 | Zhao et al. | |
| 5,891,513 A | 4/1999 | Dubin et al. | |
| 6,083,842 A * | 7/2000 | Cheung | H01L 21/76843 438/785 |
| 8,518,818 B2 * | 8/2013 | Chou | H01L 23/53238 438/626 |
| 9,240,330 B2 | 1/2016 | Takeda et al. | |

(Continued)

FOREIGN PATENT DOCUMENTS

| KR | 20140110686 A | 9/2014 |
| TW | 201401474 A | 1/2014 |

*Primary Examiner* — Karen Kusumakar
(74) *Attorney, Agent, or Firm* — Slater Matsil, LLP

(57) ABSTRACT

An embodiment is a method including forming an opening in a mask layer, the opening exposing a conductive feature below the mask layer, forming a conductive material in the opening using an electroless deposition process, the conductive material forming a conductive via, removing the mask layer, forming a conformal barrier layer on a top surface and sidewalls of the conductive via, forming a dielectric layer over the conformal barrier layer and the conductive via, removing the conformal barrier layer from the top surface of the conductive via, and forming a conductive line over and electrically coupled to the conductive via.

20 Claims, 17 Drawing Sheets

(56) References Cited

U.S. PATENT DOCUMENTS

2013/0069233 A1 3/2013 Chou et al.
2014/0252621 A1 9/2014 Lin et al.
2018/0308689 A1 10/2018 Lin et al.

* cited by examiner

INTERCONNECT STRUCTURE AND METHOD

PRIORITY CLAIM AND CROSS-REFERENCE

This application claims the benefit of U.S. Provisional Application No. 63/017,028, filed on Apr. 29, 2020, which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combinations of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
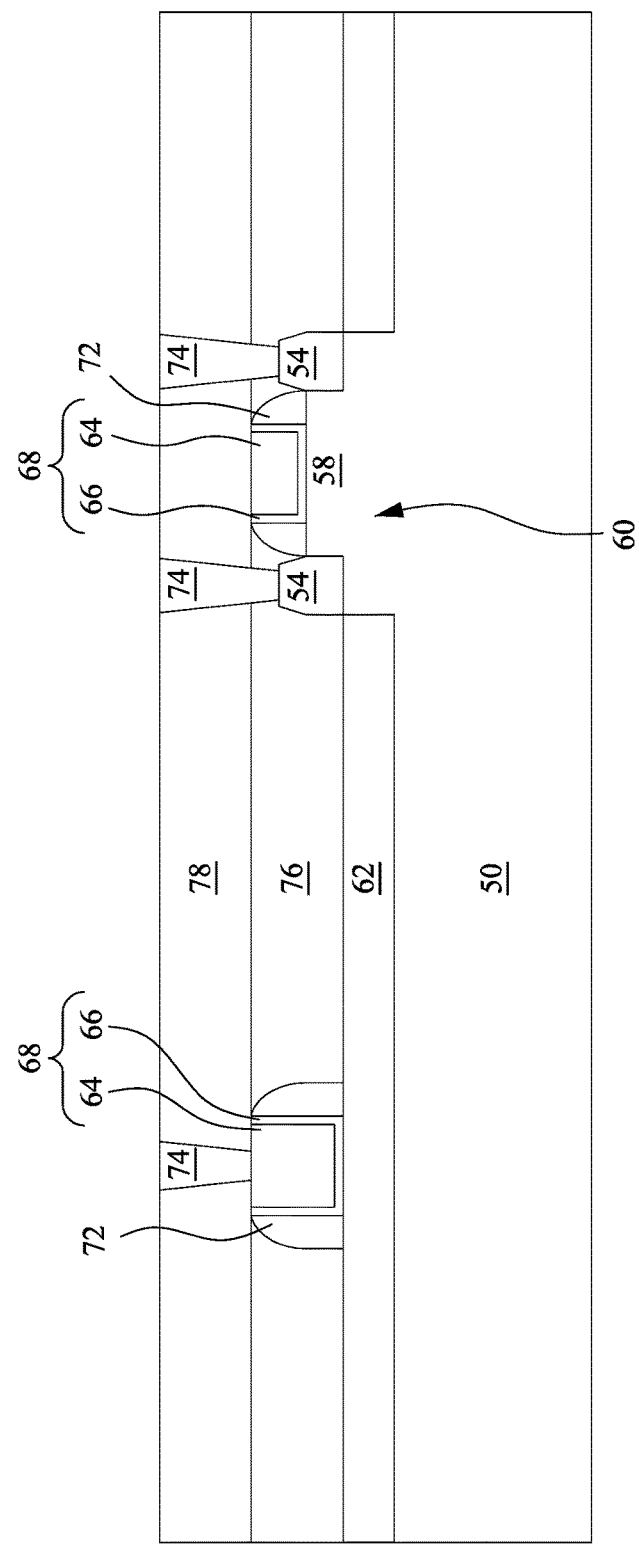
FIGS. 1 through 12 illustrate cross-sectional views of intermediate stages in the formation of interconnect structures of integrated circuits, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conductive features, such as conductive vias, conductive lines, and metallization layers in an interconnect structure, and methods of forming the same are provided, according to some embodiments. In particular, the conductive vias are formed using a separate pattern and conductive material formation process from the conductive lines. The separate pattern allows for a wider gap fill window for the conductive vias and also allows for the conductive vias to be formed without a barrier layer on the bottom surfaces of the conductive vias. Therefore, the separate pattern and formation process allows for improved metal gap filling and lower contact resistance for the conductive vias. In some embodiments, the contact resistance is lowered by 50% or more over conventionally formed conductive vias. Further, the disclosed process does not require an etch stop layer, which can improve the integrity of the barrier layer as it is not deposited on the sidewall of the etch stop layer in the via and/or line opening.

FIGS. 1 through 12 illustrate cross-sectional views of various intermediate stages in the formation of conductive features and interconnect structures of integrated circuits, in accordance with some embodiments.

FIG. 1 illustrates a cross-sectional view of a semiconductor structure on a wafer 100 comprising a substrate 50 (e.g., a semiconductor substrate) in which various electronic devices may be formed over the substrate 50, in accordance with some embodiments. A multilevel interconnect system may be formed over the various electronic devices and the substrate 50. Generally, as will be discussed in greater detail below, FIG. 1 illustrates a fin field effect transistor (FinFET) device 60 formed on a substrate 50. Planar transistors, gate-all-around (GAA) transistors, and other types of devices are within the contemplated scope of this disclosure, however.

Generally, the substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1 is a three-dimensional metal-on-semiconductor field effect transistor (MOSFET) structure formed in fin-like strips of semiconductor protrusions referred to as fins 58. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of the fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a gate-last process flow. In a gate-last process flow a sacrificial dummy gate structure (not shown) is formed after forming the STI regions 62. The dummy gate structure may comprise a dummy gate dielectric, a dummy gate electrode, and a hard mask. First, a dummy gate dielectric material (e.g., silicon oxide, silicon nitride, silicon oxynitride, or the like) may be deposited. Next, a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins 58 and extend between the fins 58 over the surface of the STI regions 62. As described in greater detail below, the dummy gate structure may be replaced by the gate structure 68 as illustrated in FIG. 1. The gate structure 68 illustrated in the right side in FIG. 1 (seen on the top of fin 58) is an example of an active gate structure which extends, e.g., along sidewalls of and over the portion of fin 58 protruding above the STI region 62. The gate structure 68 in the left side in FIG. 1 is an example gate structure extending over the STI region 62, such as between adjacent fins 58. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin 58 (as illustrated in the right side of FIG. 1) or the surface of the STI region 62 (as illustrated in the left side of FIG. 1).

Source and drain regions 54 are semiconductor regions in contact with the fin 58. In some embodiments, the source and drain regions 54 may comprise heavily-doped regions and relatively lightly-doped drain (LDD) extensions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72. In particular, the heavily-doped source and drain regions may be formed by first etching the fins to form recesses, and then depositing a crystalline semiconductor material in the recess by a selective epitaxial growth (SEG) process that may fill the recess and, typically, extend beyond and above the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, $Si_{1-x-y}Ge_xC_y$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from $10^{14}$ cm$^{-2}$ to $10^{16}$ cm$^{-2}$) of dopants may be introduced into the heavily-doped source and drain regions 54 either in situ during SEG, or by an ion implantation process performed after the SEG, or by a combination thereof. The source and drain regions 54 may be formed by other processes, such as ion implantation of dopants, and the like.

Still referring to FIG. 1, a first interlayer dielectric (ILD) layer 76 is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be coplanar (within process variations) with the top surface of the first ILD layer 76.

The HKMG gate structures 68, illustrated in FIG. 1, may then be formed by first removing the dummy gate structures using one or more etching techniques, thereby creating recesses between respective spacers 72. Next, a replacement gate dielectric layer 66 comprising one or more dielectrics, followed by a replacement conductive gate layer 64 comprising one or more conductive materials, may be deposited to completely fill the recesses. The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like. Excess portions of the gate structure layers 64 and 66 may be removed from over the top surface of first ILD layer 76 using, for example a CMP process. The resulting structure, as illustrated in FIG. 1, may be a coplanar surface (within process variations) comprising an exposed top surface of the first ILD layer 76, the spacers 72, and remaining portions of the HKMG gate layers (i.e., the gate structure layers 64 and 66) inlaid between respective spacers 72.

A second ILD layer 78 may be deposited over the first ILD layer 76, as illustrated in FIG. 1. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, PVD, ALD, PEALD, PECVD, SACVD, FCVD, spin-on, and/or the like, or a combination thereof. In some embodiments, one or more etch stop layers (not specifically illustrated) are also formed over the structure above and/or below the illustrated ILD layers.

As illustrated in FIG. 1, electrodes of electronic devices formed in the substrate 50 may be electrically connected to conductive features of a first interconnect level (formed subsequently in later figures) using conductive connectors (e.g., contact plugs 74) formed through the intervening dielectric layers. In the example illustrated in FIG. 1, the contact plugs 74 make electrical connections to the source and drain regions 54 of FinFET 60. Contact plugs 74 to gate electrodes are typically formed over STI regions 62. A separate gate electrode 64 (shown in the left in FIG. 1) illustrates such contacts. The contact plugs 74 may be formed using photolithography techniques. For example, a patterned mask may be formed over the second ILD layer 78 and used to etch openings that extend through the second ILD layer 78 to expose a portion of gate electrodes 64 over STI regions 62, as well as etch openings over the fins 58 that extend further, through the first ILD layer 76 and the CESL (not shown) liner below first ILD layer 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the conductive gate layer 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL. While the two ILD layers (e.g., the first ILD layer 76 and the second ILD layer 78) are illustrated, embodiments having only a single ILD layer, or having three or more ILD layers, are within the contemplated scope of this disclosure.

In some embodiments, a conductive liner may be formed in the openings in the first ILD layer 76 and the second ILD layer 78. Subsequently, the openings are filled with a conductive fill material. The liner comprises barrier metals used to reduce out-diffusion of conductive materials from the contact plugs 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, the like, or any combination thereof) may be deposited over the conductive liner layer to fill the contact openings, using any acceptable deposition technique (e.g., CVD, ALD, PEALD, PECVD, PVD, ECP, electroless plating, the like, or any combination thereof). Next, a planarization process (e.g., CMP) may be used to remove excess portions of all the conductive materials from over the surface of the second ILD layer 78. The resulting conductive plugs extend into the first and second ILD layers 76 and 78 and constitute contact plugs 74 making physical and electrical connections to the electrodes of electronic devices, such as a tri-gate FinFET, as illustrated in FIG. 1. In some embodiments, a width of the contact plugs 74 gets smaller going from a top surface of the contact plugs 74 to a bottom surface of the contact plugs 74. Said another way, in some embodiments, the contact plugs 74 taper from the top surface to the bottom surface. In this example, contacts to electrodes over STI region 62 and to electrodes over fins 58 are formed simultaneously using the same processing steps. However, in other embodiments these two types of contacts may be formed separately.

Figure 2:
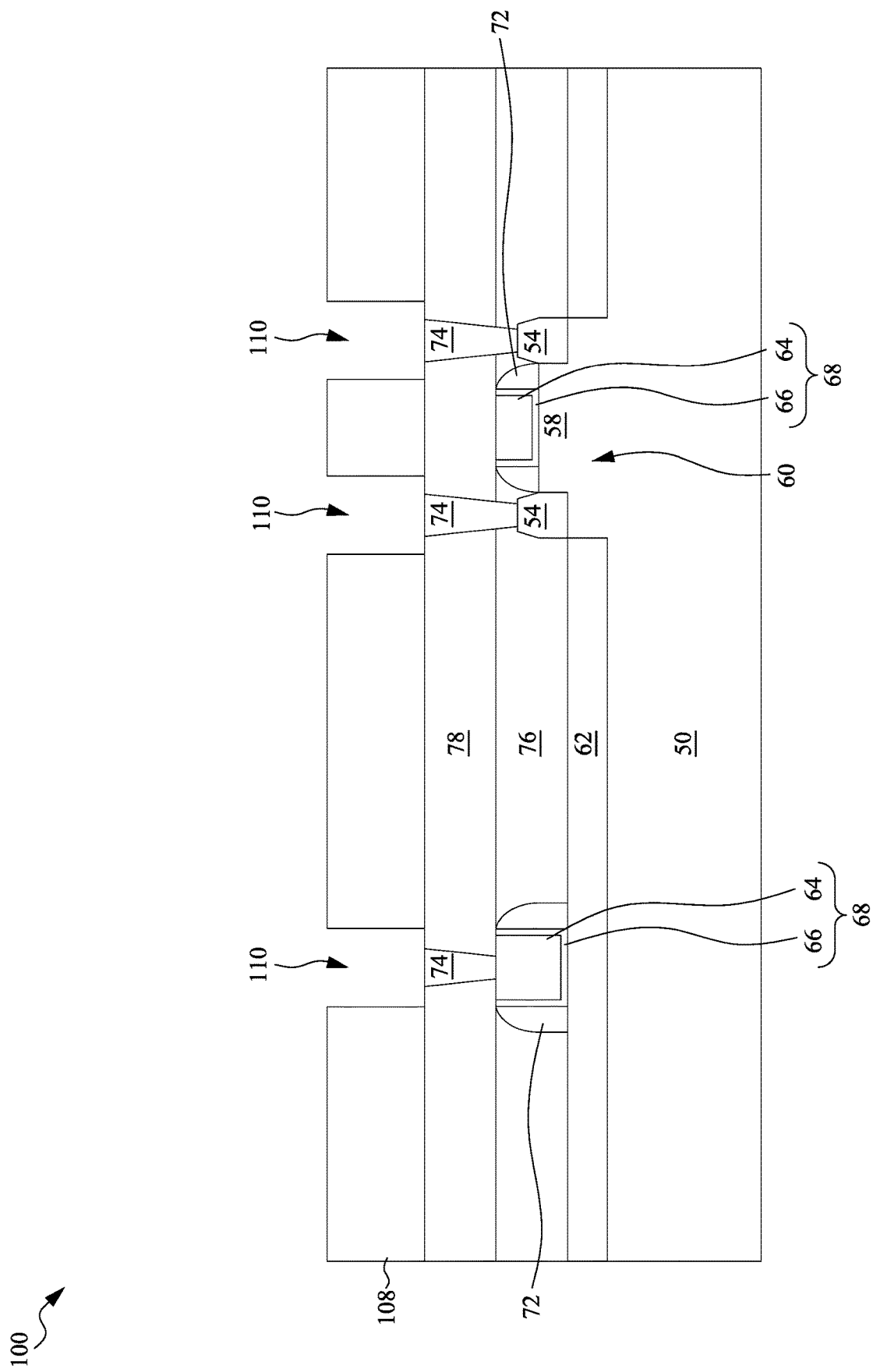

In FIG. 2, a photoresist 108 is formed over the FinFETs 60 and other electronic devices, the second ILD layer 78, and the contact plugs 74. The photoresist 108 may be formed to a thickness in a range from 50 nm to 150 nm, such as 100 nm. The photoresist 108 is then patterned to form via openings 110 over the contact plugs 74. In some embodiments, sidewalls of the via openings 110 are perpendicular (within process variations) to a major surface of the substrate 50.

Figure 3:
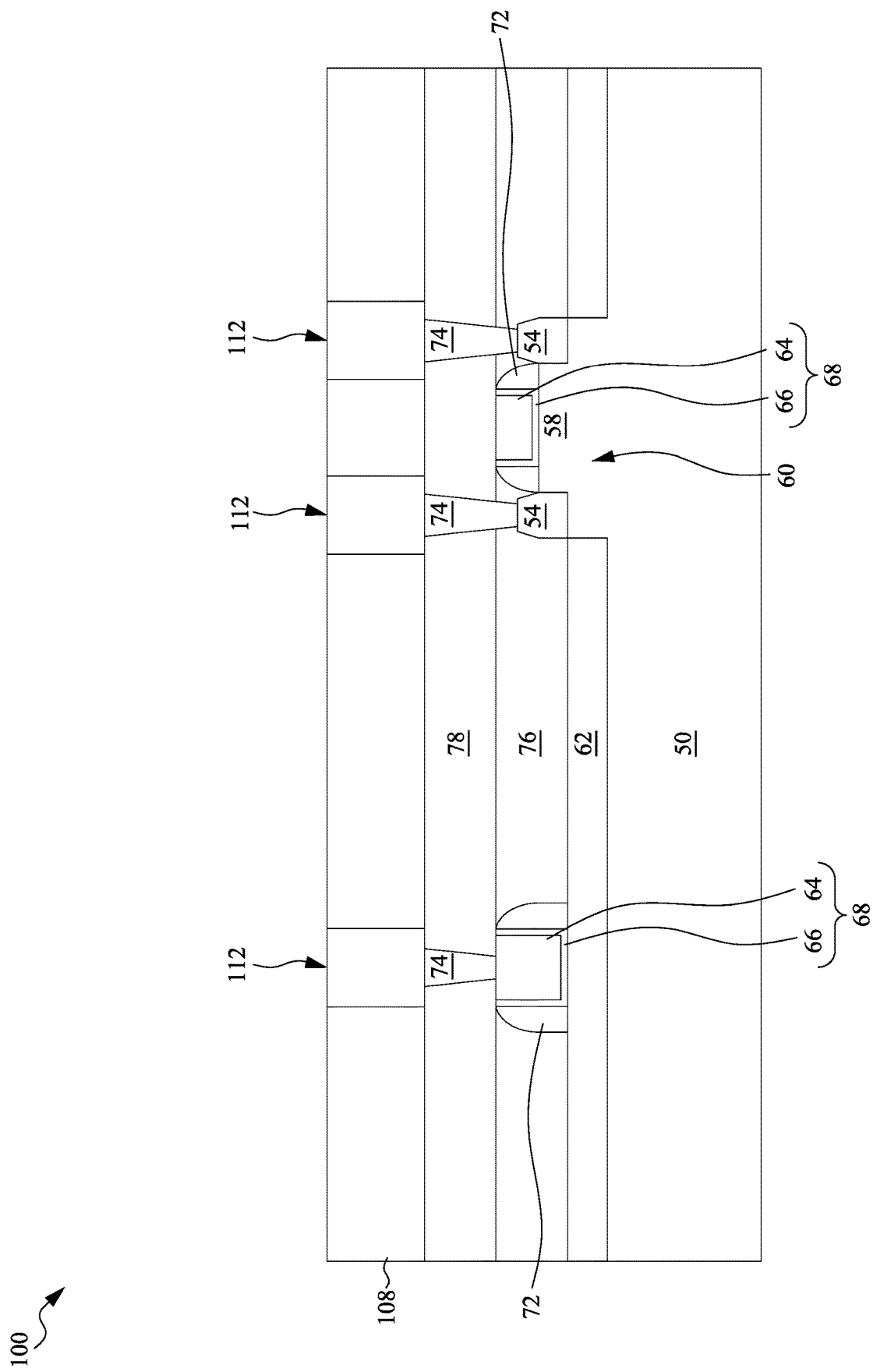

As illustrated in FIG. 3, a metal material is formed in the via openings 110. In some embodiments, the via openings 110 are filled with the metal material. The metal material may be formed by, for example, a plating process, such as an electroless plating process or the like. The electroless plating process may also be referred to as an electroless deposition (ELD) process. The metal material that is formed in the via openings 110 may be copper, cobalt, nickel, the like, or a combination thereof. Following the formation of the metal material, a planarization process, such as a chemical-mechanical polish (CMP) process, may be performed to remove the excess portions of the metal material, which excess portions are over a surface of the photoresist 108. In some embodiments, the planarization process may be omitted as there may not be an excess portions of the metal material or the excess portions may be within allowable tolerances. The formation of the metal material in the via openings 110 forms conductive vias 112. The conductive vias 112 are used to provide electrical connection to the contact plugs 74. After the planarization process, the conductive vias 112 have top surfaces coplanar (within process variations) with a top surfaces of the photoresist 108. In some embodiments, sidewalls of the conductive vias 112 are perpendicular (within process variations) to the major surface of the substrate 50 and the sidewalls of the contact plugs 74 are not perpendicular to the major surface of the substrate 50. Said another way, the conductive vias 112 have a same width from a top surface to a bottom surface and the contact plugs taper from a top surface to a bottom surface.

In some embodiments, the conductive vias 112 have a height less than or equal to 100 nm, such as in a range from 40 nm to 100 nm. In some embodiments, the conductive vias 112 have a width less than or equal to 20 nm, such as in a range from 8 nm to 20 nm.

Figure 4:
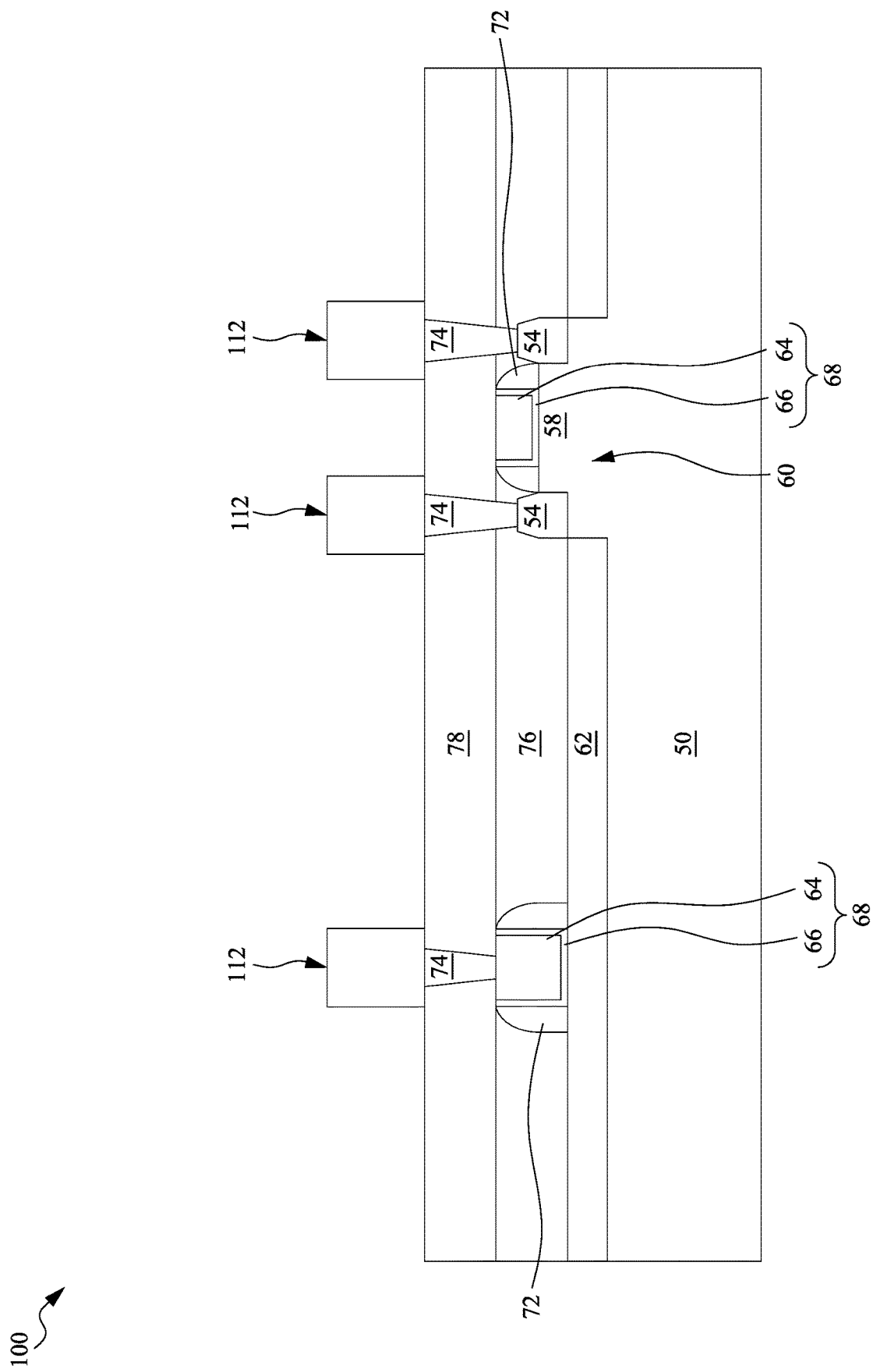

As illustrated in FIG. 4, following the formation of the conductive vias 112, the photoresist 108 is removed. The photoresist 108 may be removed by an acceptable ashing or stripping process, such as using an oxygen plasma or the like.

Figure 5:
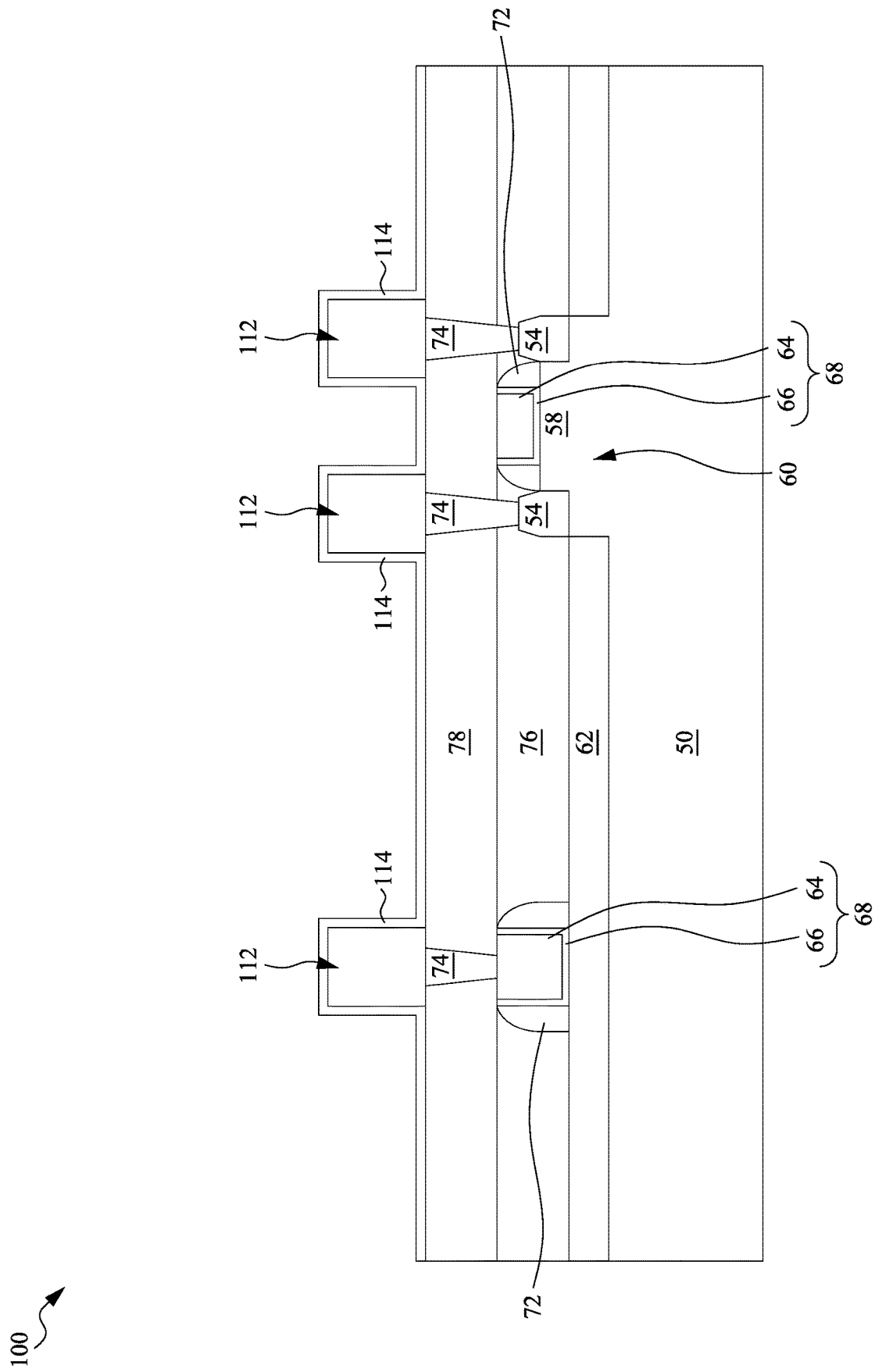

In FIG. 5, a barrier layer 114 is formed on top surfaces and sidewalls of the conductive vias 112 and along a top surface of the second ILD layer 78. The barrier layer 114 acts as a barrier between the conductive vias 112 and the subsequently formed dielectric layer 116 (see, e.g., FIG. 6). As an example, the barrier layer 114 can help to prevent diffusion of the metal material of the conductive vias 112 into the surrounding dielectric layer 116. In some embodiments, the barrier layer 114 may be formed as a conformal layer, for example, with the thicknesses of horizontal portions and vertical portions having a difference smaller than 10 percent of the horizontal thickness. In accordance with some embodiments, the formation of the barrier layer 114 may include ALD, PVD, the like, or a combination thereof. The barrier layer 114 may be formed of tantalum, titanium, tantalum nitride, titanium nitride, the like or a combination thereof. In some embodiments, the barrier layer 114 is formed to a thickness less than or equal to 5 nm, such as in a range from 2 nm to 5 nm.

Figure 6:
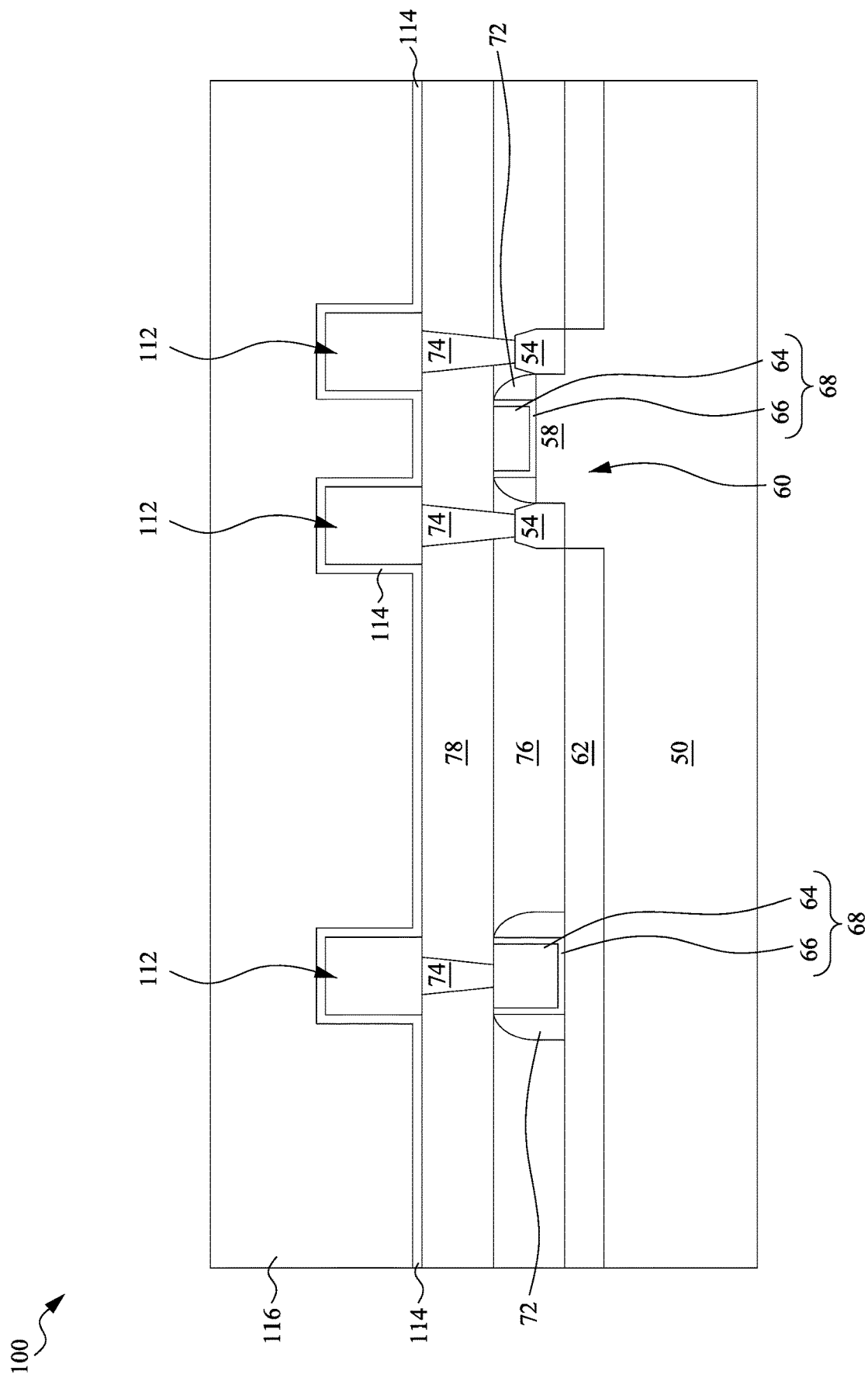

In FIG. 6, a dielectric layer 116 is formed over the second ILD layer 78 and the barrier layer 114 on the top and sidewalls of the conductive vias 112. The dielectric layer 116 provides electrical isolation between the conductive vias 112 and also provides structure support to overlying structures. The dielectric layer 116 may be formed by a spin-on coating process or the like. The dielectric layer 116 may be a layer formed from a low-k dielectric material having a k-value lower than 3.0. The dielectric layer 116 may be a layer formed from an extra-low-k (ELK) dielectric material having a k-value of less than 2.5. In some embodiments, the dielectric layer 116 may be formed from an oxygen-containing and/or carbon containing low-k dielectric material, Hydrogen SilsesQuioxane (HSQ), MethylSilsesQuioxane (MSQ), or the like.

Figure 7:
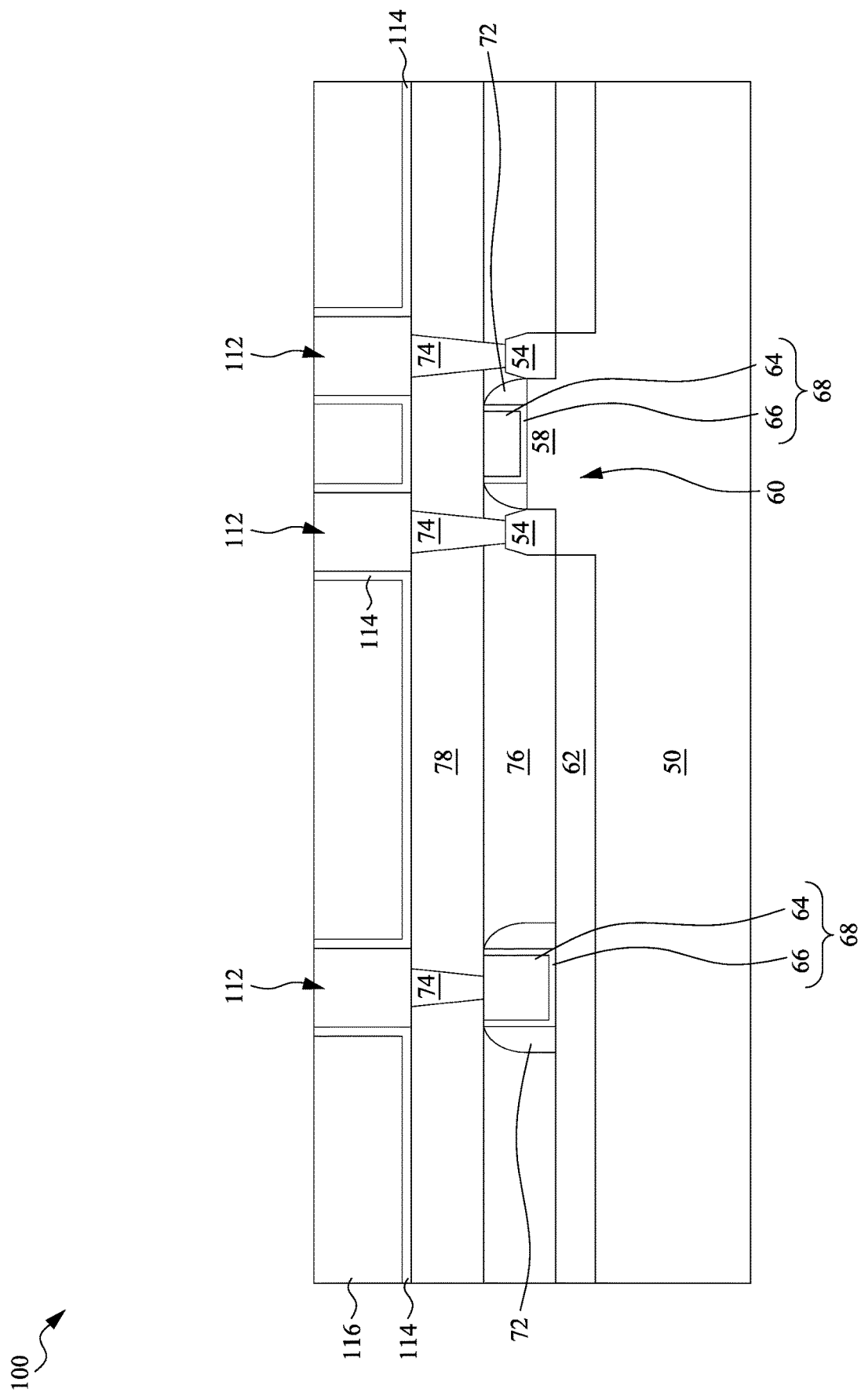

As illustrated in FIG. 7, a planarization process, e.g., a CMP process, is performed to planarize a top surface of the wafer 100 and to expose the top surfaces of the conductive vias 112. In an embodiment, a CMP process is performed to remove excess portions of the dielectric layer 116 and portions of the barrier layer 114 over the conductive vias 112 to expose the top surfaces of the conductive vias 112. After the planarization process, top surfaces of the barrier layer 114, conductive vias 112, and dielectric layer 116 are coplanar (within process variations). Further, bottom surfaces of the barrier layer 114, conductive vias 112, and dielectric layer 116 are coplanar (within process variations).

Figure 8:
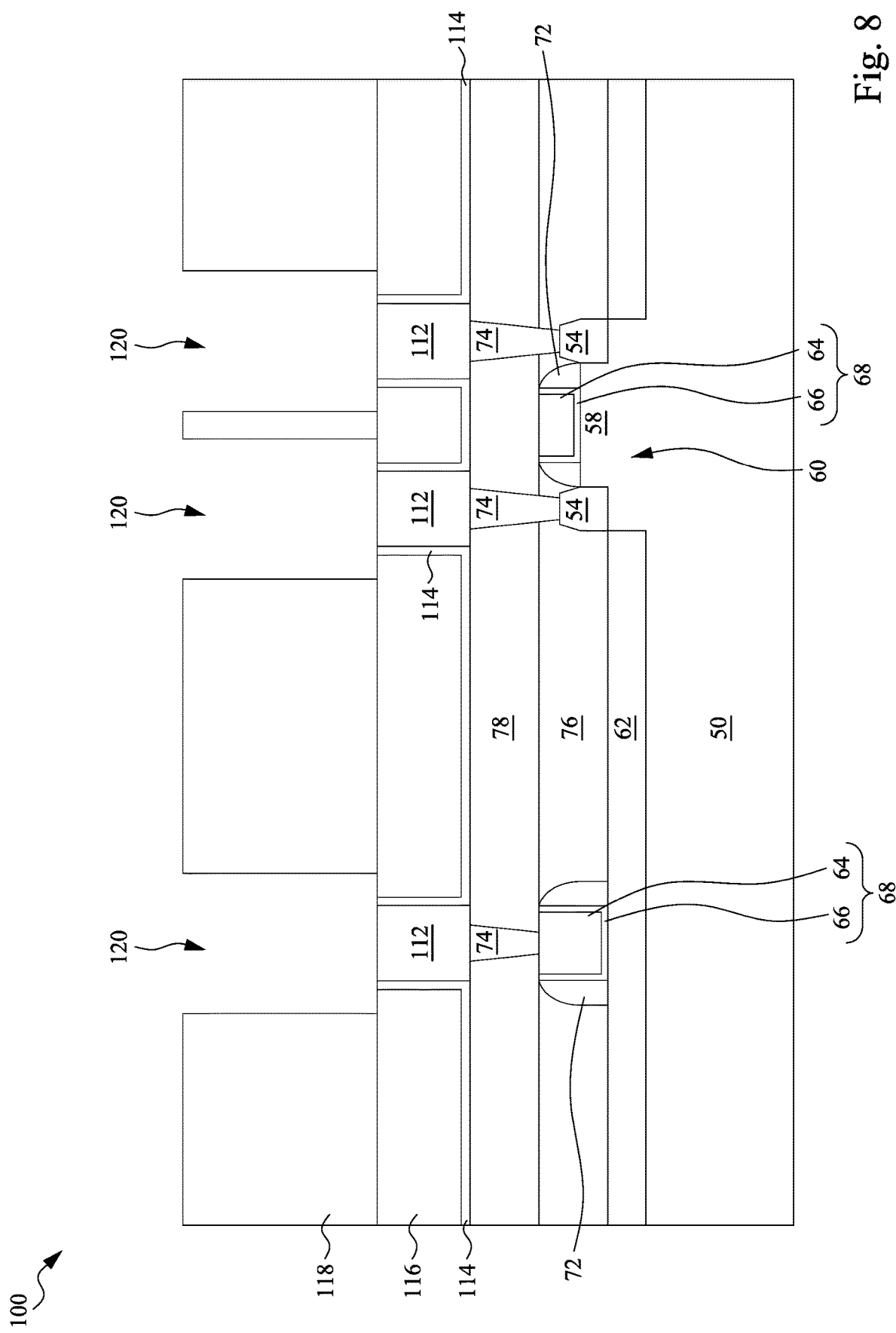

FIG. 8 illustrates the deposition and patterning of a dielectric layer 118 over the dielectric layer 116 and the conductive vias 112. The dielectric layer 118 provides electrical isolation between the subsequently formed conductive lines 128 and also provides structure support to overlying structures. The dielectric layer 118 may be a layer formed from a low-k dielectric material having a k-value lower than 3.0. The dielectric layer 118 may be a layer formed from an extra-low-k (ELK) dielectric material having a k-value of less than 2.5. In some embodiments, the dielectric layer 118 may be formed from an oxygen-containing and/or carbon containing low-k dielectric material, Hydrogen SilsesQuioxane (HSQ), MethylSilsesQuioxane (MSQ), or the like. The dielectric layer may be formed by a CVD process, for example.

Following the deposition of the dielectric layer 118, trench openings 120 are formed in the dielectric layer 118 over the conductive vias 112 to expose the conductive vias 112. The trench openings 120 may be formed by a patterning and etching process, for example.

Figure 9:
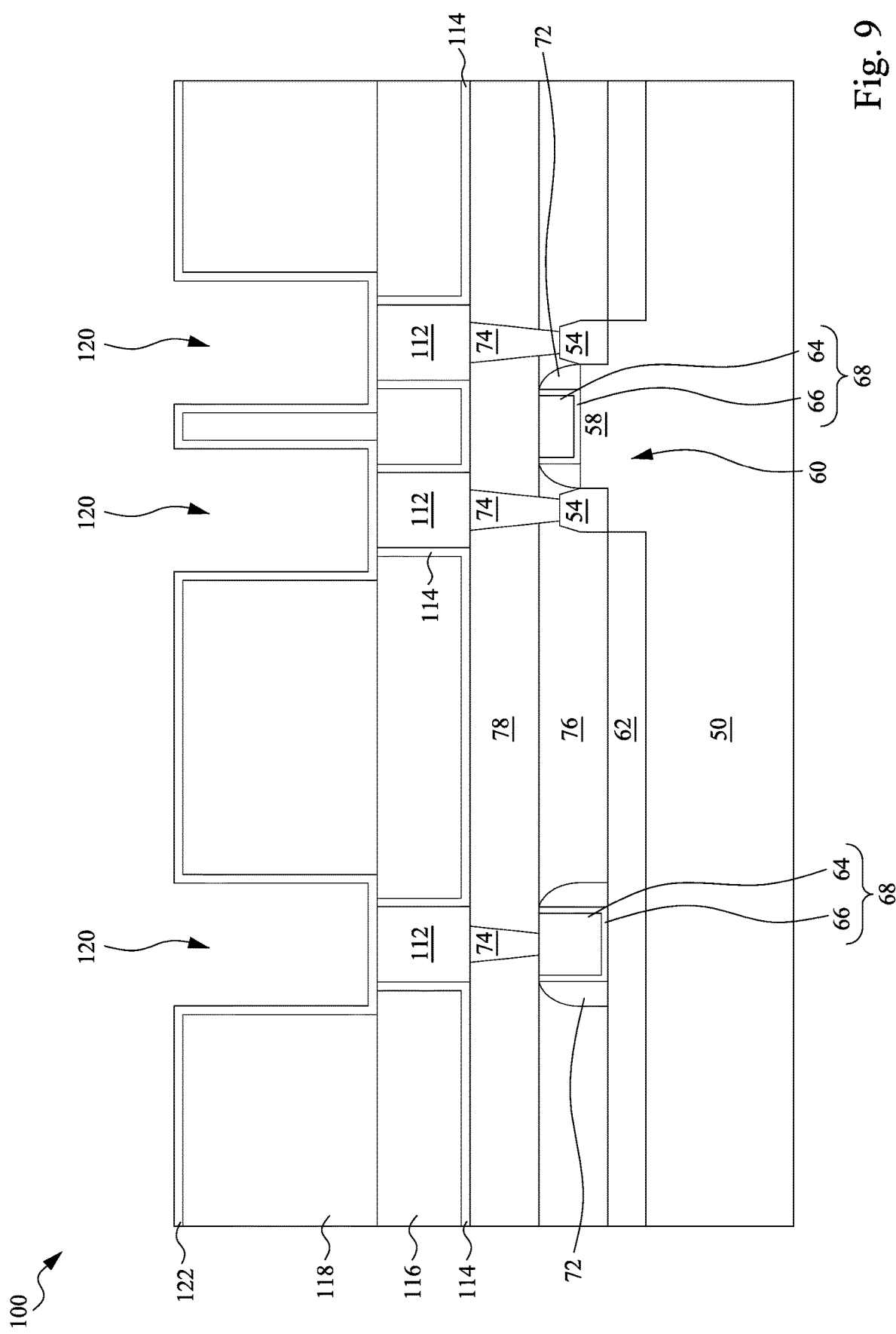

In FIG. 9, a barrier layer 122 is formed on the exposed surface of the wafer 100 (e.g., on the dielectric layer 118) and on the sidewalls and the bottom surface of the trench openings 120. The barrier layer 122 acts as a barrier between the subsequently formed conductive lines 128 and the dielectric layers 116 and 118 (see, e.g., FIG. 12). As an example, the barrier layer 122 can help to prevent diffusion of the metal material(s) of the conductive lines 128 into the surrounding dielectric layers 116 and 118. In accordance with some embodiments, the formation of the barrier layer 122 may include ALD, PVD, the like, or a combination thereof. The barrier layer 122 may be formed of tantalum, titanium, tantalum nitride, titanium nitride, the like or a combination thereof. In some embodiments, the barrier layer 122 is formed to a thickness less than or equal to 5 nm, such as in a range from 2 nm to 5 nm.

Figure 10:
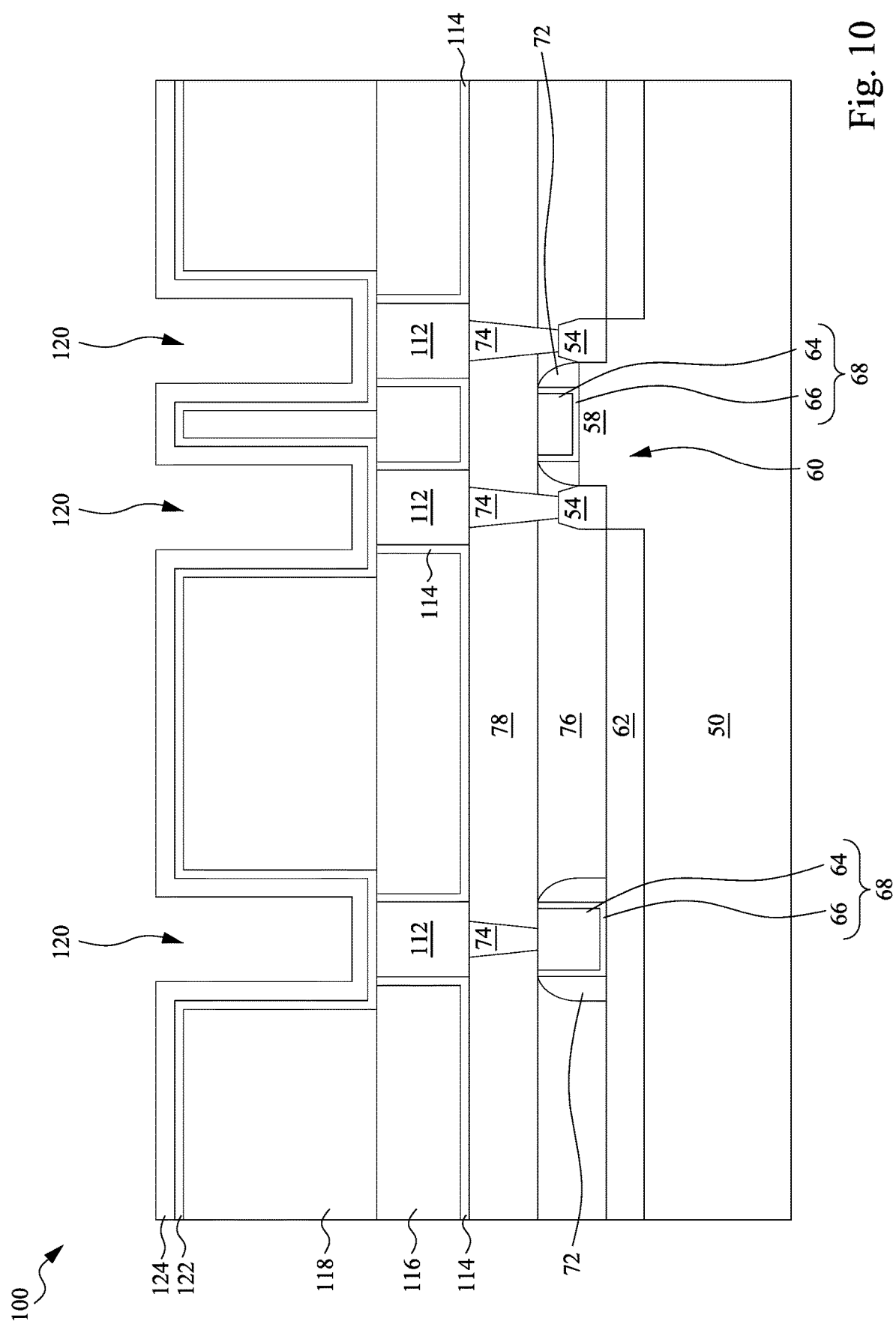

FIG. 10 illustrates the formation of a seed layer 124 on the barrier layer 122 formed on the dielectric layer 118 and on the sidewalls and the bottom surface of the trench openings 120. The seed layer 124 provides a conductive material for the subsequent plating process used to form conductive material 126 (see, e.g., FIG. 11). In accordance with some embodiments, the formation of the seed layer 124 may include ALD, CVD, PVD, the like, or a combination thereof. The seed layer 124 may include copper or a copper alloy. In some embodiments, the seed layer may be formed to have a thickness of less than or equal 10 nm, such as in a range from 4 nm to 10 nm.

Figure 11:
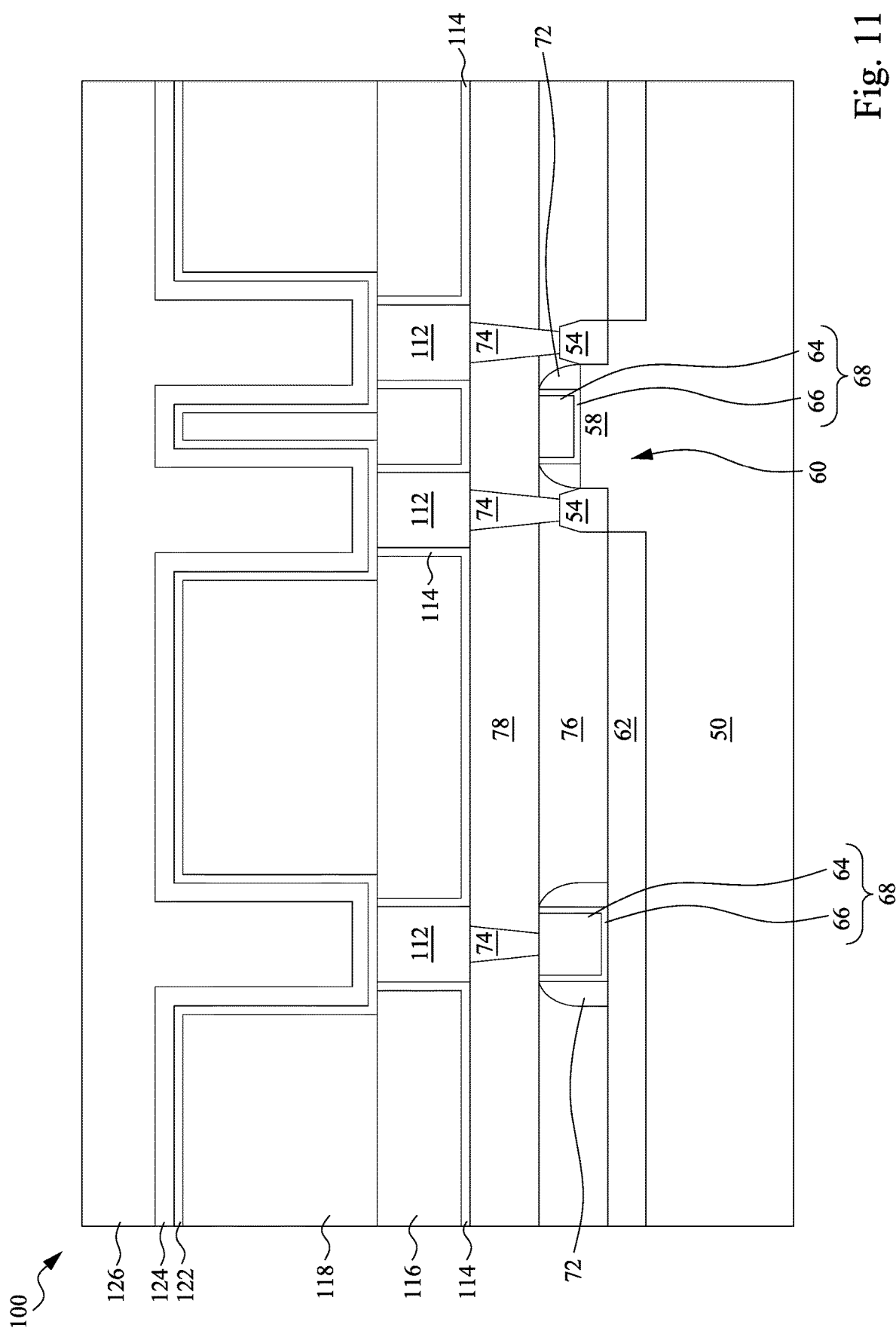

In FIG. 11, a conductive material 126 is filled into the openings 120 over the seed layer 124. Excess conductive material 126 may also be formed along top surfaces of the seed layer 124. The conductive material 126 may be a metallic material including a metal or a metal alloy such as copper, silver, gold, tungsten, cobalt, aluminum, or alloys thereof. The openings 120 may be filled using an electroplating process, such as high voltage electroplating. In other embodiments, the openings 120 may be filled using CVD, PVD, ALD, or electro-less plating.

Figure 12:
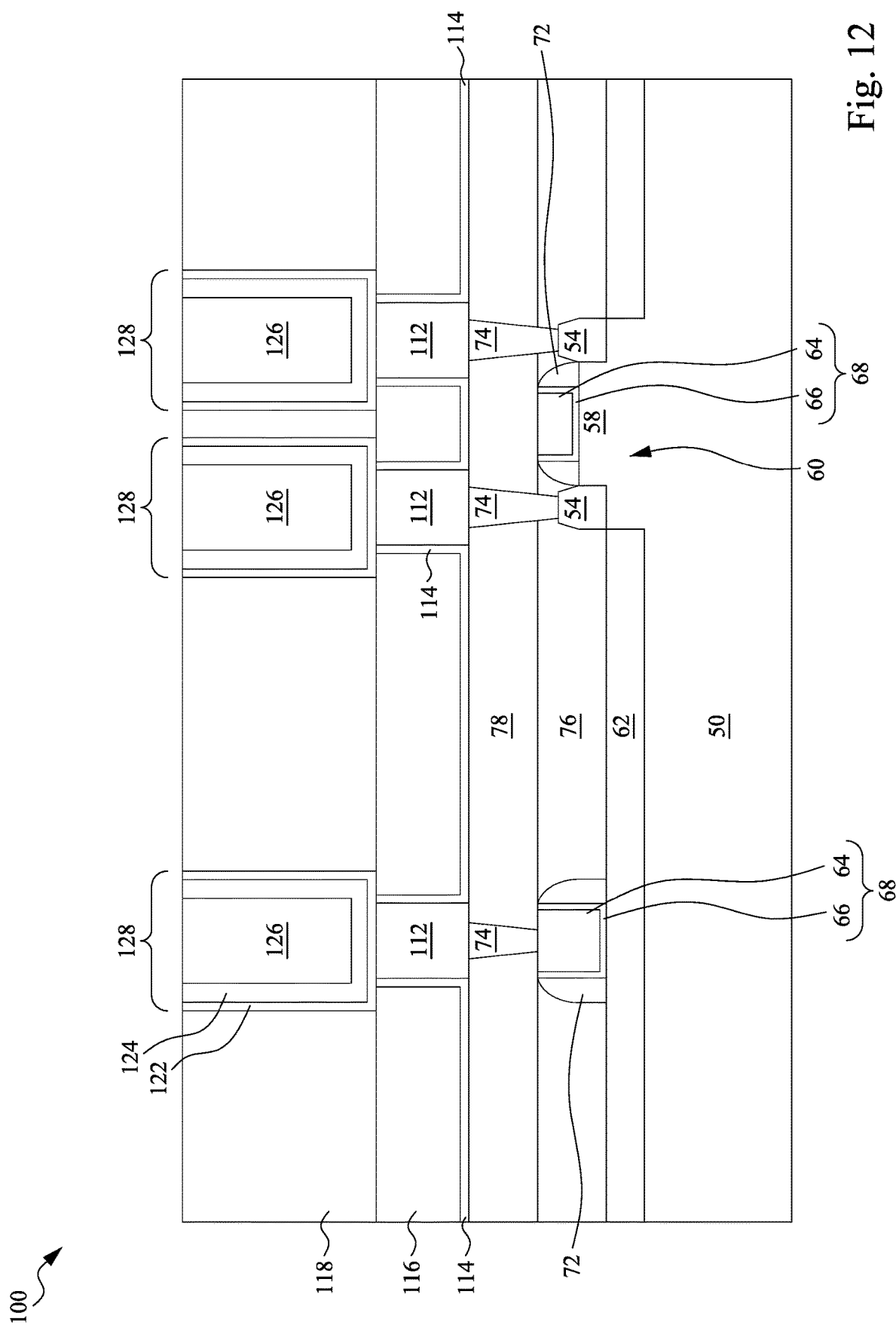

In FIG. 12, a planarization process may be performed to remove excess portions of the conductive material 126, the seed layer 124, the barrier layer 122, thereby forming conductive lines 128 in the openings 120. The planarization process may be a grinding or a CMP, and may be performed such that the top surfaces of the conductive material 126, the seed layer 124, the barrier layer 122, and the dielectric layer are coplanar (within process variations). The conductive lines 128 include remaining portions of the conductive material 126 and the remaining portions of the seed layer 124 and the barrier layer 122 extending along the sidewalls and bottoms of the conductive material 126. The conductive lines 128 are, therefore, physically and electrically connected to the conductive vias 112. In some embodiments, the conductive lines 128 have a height less than or equal to 100 nm, such as in a range from 40 nm to 100 nm. In some embodiments, the conductive lines 128 have a width less than or equal to 30 nm, such as in a range from 14 nm to 30 nm.

The process of forming the conductive vias 112 and conductive lines 128 in FIGS. 2 through 12 can be repeated to form as many layers of the interconnect structure as desired and/or required for the integrated circuit.

The process and structure described in FIGS. 1 through 12 achieves advantages. In particular, the conductive vias 112 are formed using a separate pattern and conductive material formation process from the conductive lines 128. The separate pattern allows for a wider gap fill window for the conductive vias 112 and also allows for the conductive vias 112 to be formed without a barrier layer on the bottom surfaces of the conductive vias 112. Therefore, the separate pattern and formation process allows for improved metal gap filling and lower contact resistance for the conductive vias 112. Further, the disclosed process does not require an etch stop layer, which can improve the integrity of the barrier layers 114/122 as it is not deposited on the sidewall of the etch stop layer in the via and/or line opening.

Although the process of forming the conductive vias 112 and conductive lines 128 in FIGS. 2 through 12 was described as being formed over contact plugs 74 that are coupled to gate electrodes and source/drain regions of transistors, the process of forming the conductive vias 112 and conductive lines 128 is applicable to other structures. For example, the process of forming the conductive vias 112 and conductive lines 128 could be utilized in place of the contact plugs 74 to have the conductive vias 112 make connection with the gate electrodes and source/drain regions. Also, the process of forming the conductive vias 112 and conductive lines 128 could be applied to connections to features in the substrate 50.

Figure 13:
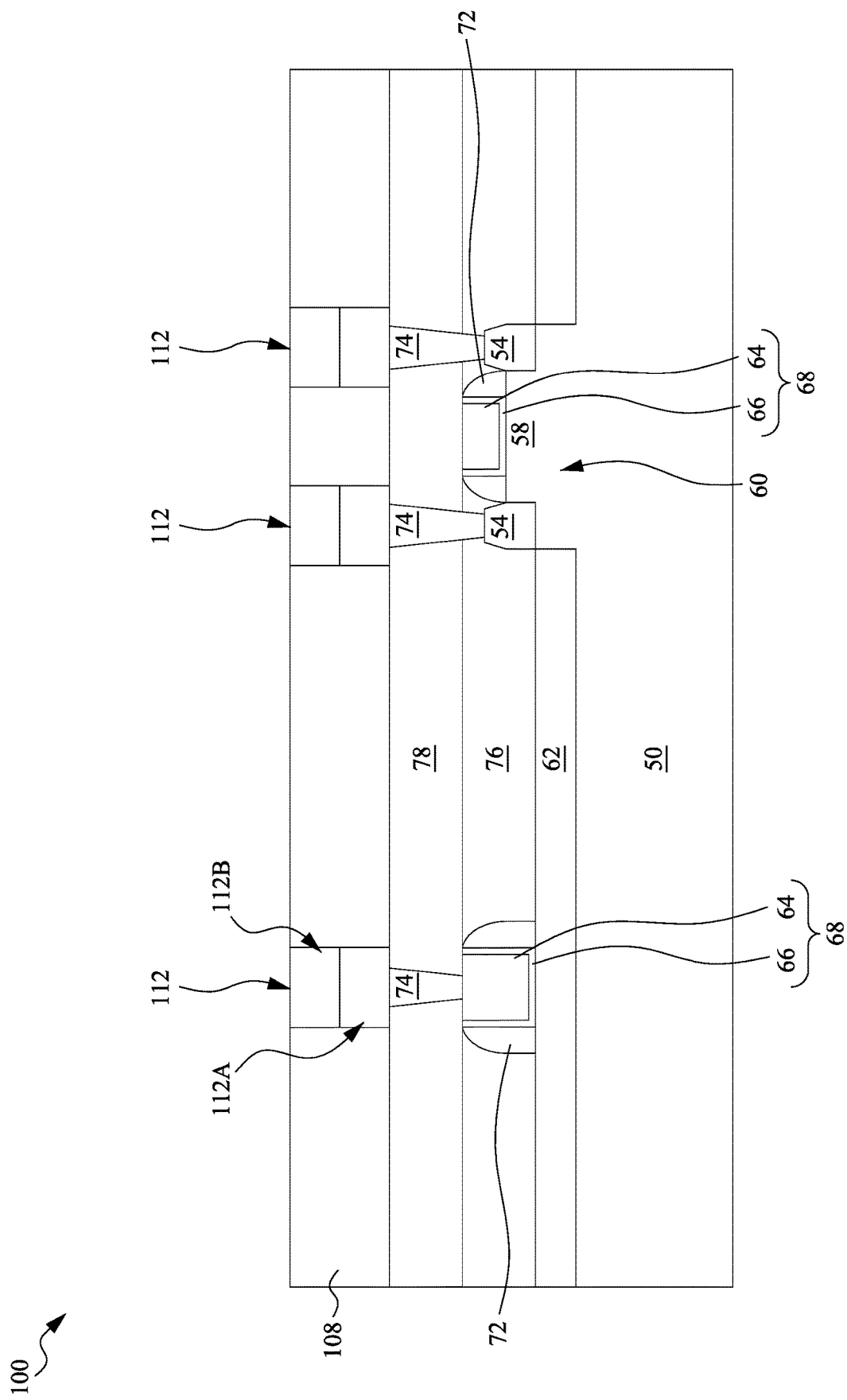
FIGS. 13 through 14 illustrate cross-sectional views of intermediate stages in the formation of interconnect structures of integrated circuits, in accordance with some embodiments.
Figure 14:
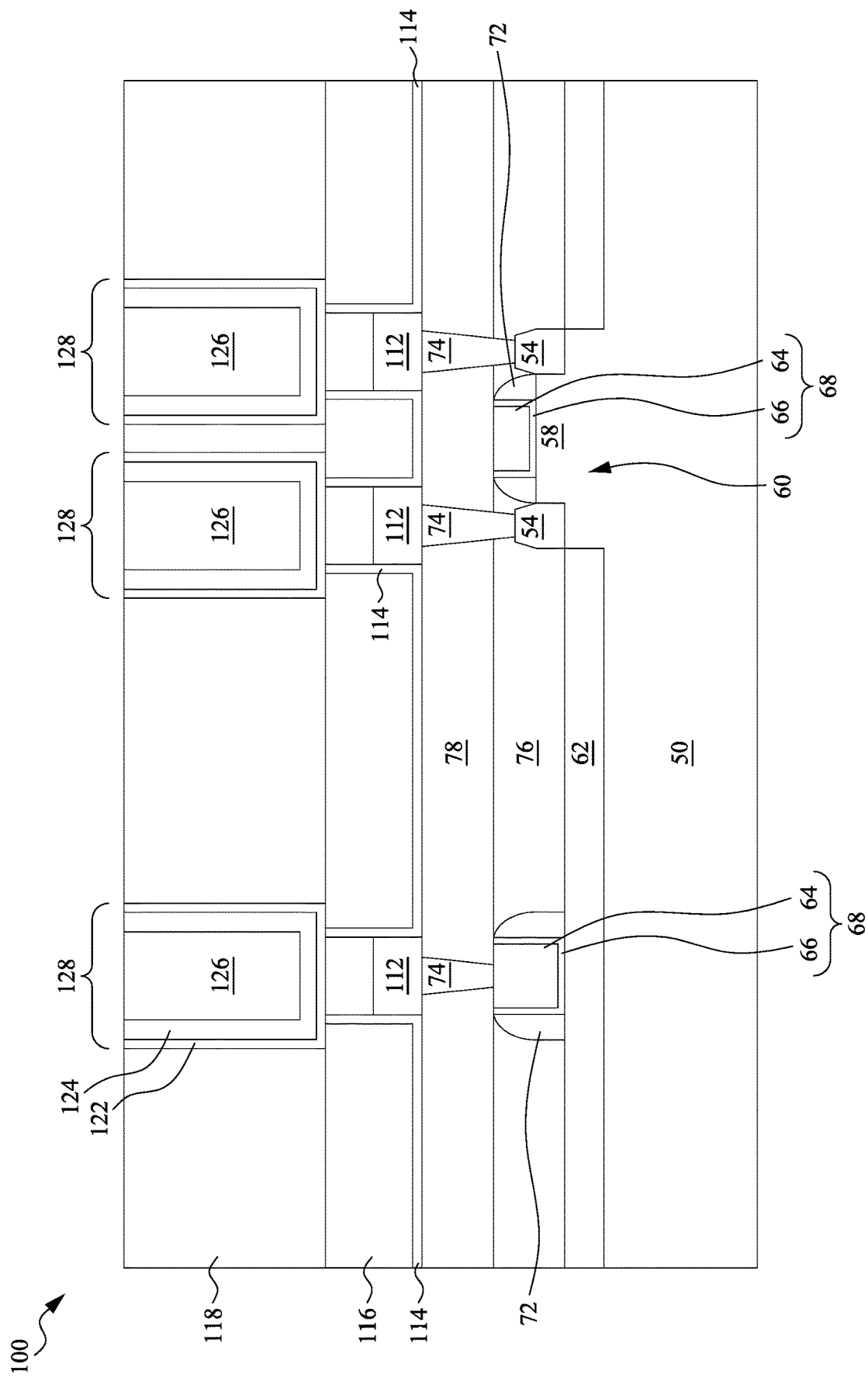

FIGS. 13 and 14 illustrate various intermediate stages in the formation of conductive features and interconnect structures of integrated circuits, in accordance with some embodiments. This embodiment is similar to the previous embodiment except that in this embodiment conductive vias 112 are multi-layer stack of conductive materials. Details regarding this embodiment that are similar to those for the previously described embodiment will not be repeated herein.

FIG. 13 is an intermediate stage of processing similar to that illustrated and described above in FIG. 3 and the details of achieving this intermediate stage of process will not be repeated herein.

In FIG. 13, a multi-layer stack of metal material is formed in the via openings 110. The multi-layer stack vias can have improved reliability due to, for example, the top layer in the multi-layer stack of metal acting as a capping layer and preventing electromigration of overlying metal layers into the via. In some embodiments, the via openings 110 are filled with the multi-layer stack of metal material, such as a first metal layer 112A and a second metal layer 112B over the first metal layer 112A. The multi-layer stack of metal material may be formed by, for example, multiple plating processes, such as multiple electroless plating process (ELD process) or the like. The metal material that is formed in the via openings 110 may be copper, cobalt, nickel, the like, or a combination thereof. In a specific example, the first metal layers 112A is a copper layer deposited by a first ELD process and the second metal layer 112B is a cobalt layer deposited by second ELD process. In this specific embodiment, the cobalt layer acts as a capping layer and can prevent electromigration of overlying layers into the conductive via 112, and thus, can improve the reliability of the interconnect structure. The first metal layer 112A may be formed to partially fill the via openings 110 and then the second metal layer 112B may be formed on the first metal layer 112A to fill the remaining portion of the via openings 110.

Following the formation of the metal layers, a planarization process, such as a CMP process, may be performed to remove the excess portions of the second metal layer 112B, which excess portions are over a surface of the photoresist 108. In some embodiments, the planarization process may be omitted as there may not be excess portions of the metal layers or the excess portions may be within allowable tolerances.

FIG. 14 illustrates a structure after subsequent processing on the structure of FIG. 13. The processing steps between FIGS. 13 and 14 are similar to those illustrated and described above in FIGS. 3 through 12 and the description is not repeated herein.

Figure 15:
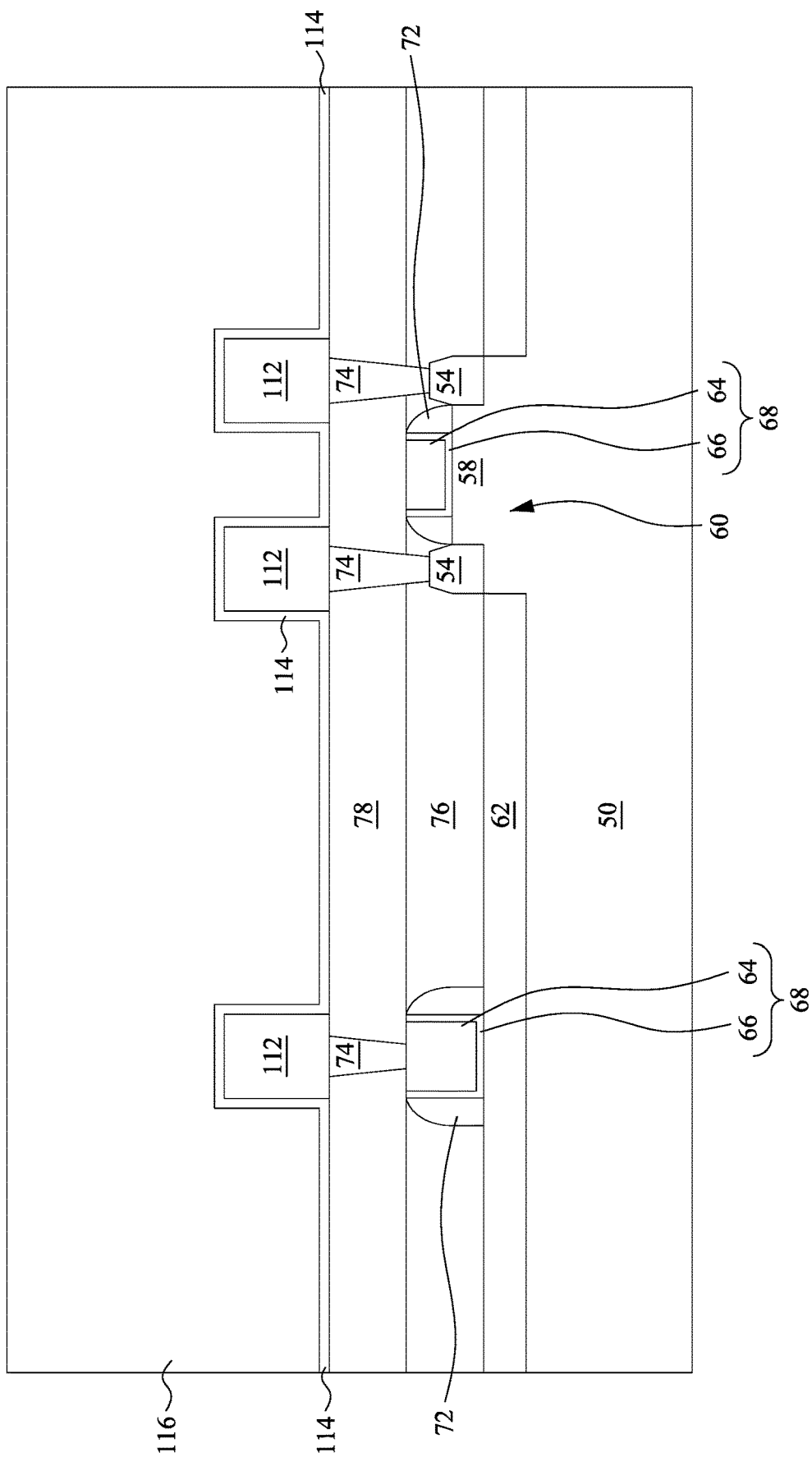
FIGS. 15 through 17 illustrate cross-sectional views of intermediate stages in the formation of interconnect structures of integrated circuits, in accordance with some embodiments.
Figure 16:
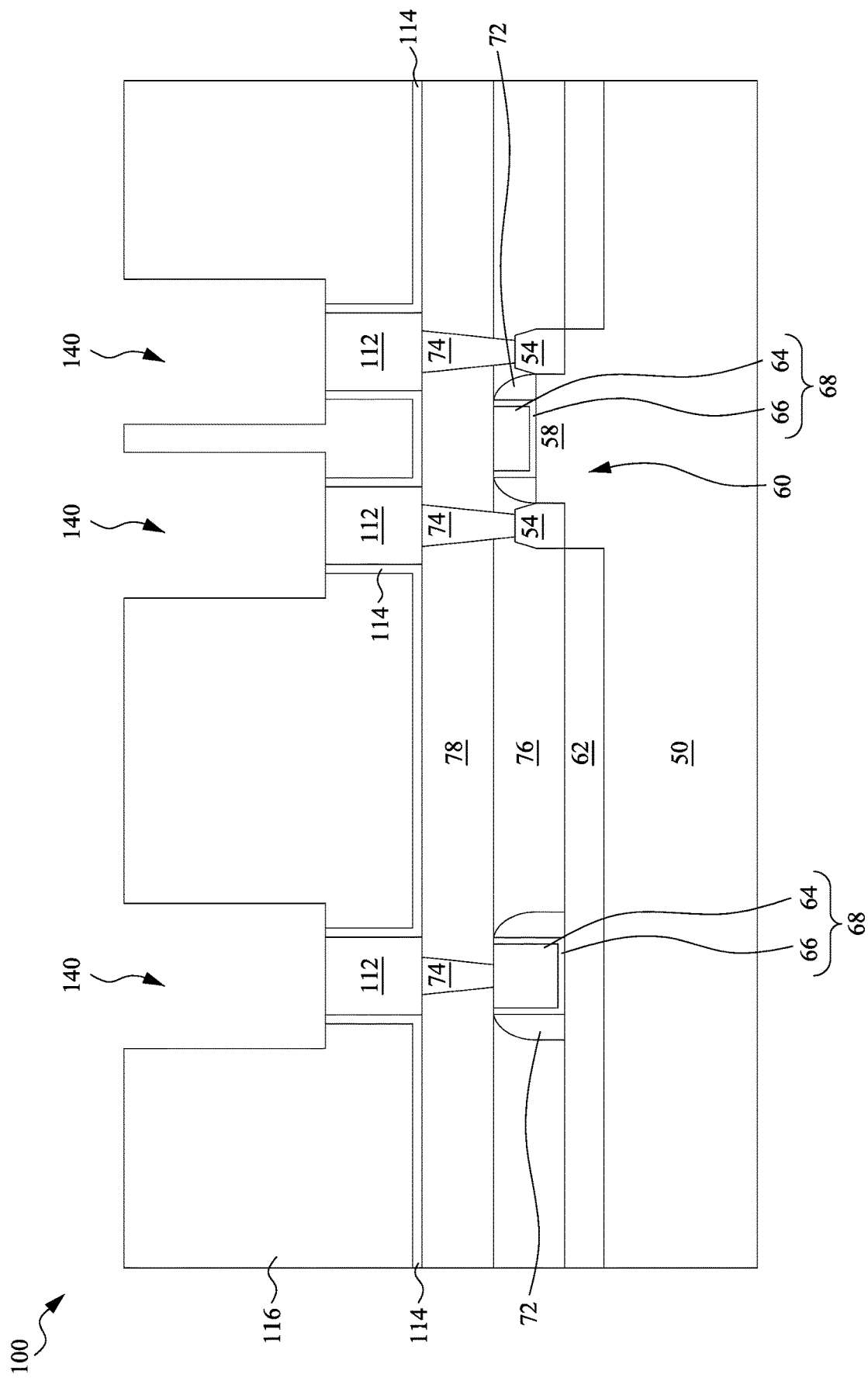
Figure 17:
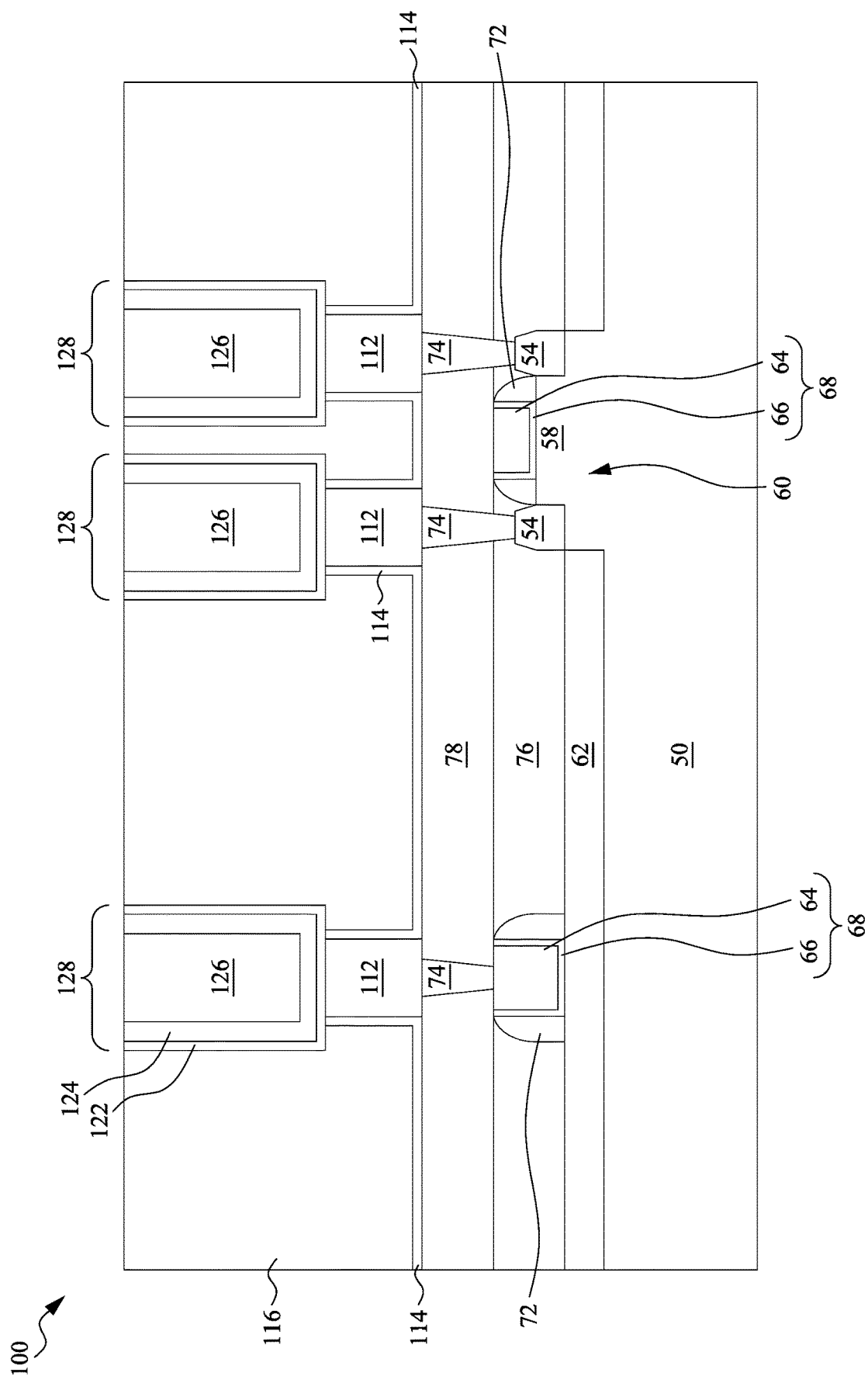

FIGS. 15 through 17 illustrate various intermediate stages in the formation of conductive features and interconnect structures of integrated circuits, in accordance with some embodiments. This embodiment is similar to the previous embodiments except that in this embodiment the dielectric layer 118 is omitted and the conductive vias 112 and conductive lines 128 are formed in the dielectric layer 116. This embodiment allows for the removal of a planarization step of dielectric layer 116 and the formation step of the dielectric layer 118. Details regarding this embodiment that are similar to those for the previously described embodiment will not be repeated herein.

FIG. 15 is an intermediate stage of processing similar to that illustrated and described above in FIG. 6 and the details of achieving this intermediate stage of process will not be repeated herein In some embodiments, the dielectric layer 116 may be formed to a thickness of less than or equal to 150 nm, such as in a range from 80 nm to 150 nm.

In FIG. 16, the formation of the formation of trench openings 140 is illustrated. The trench openings 140, similar to trench openings 120 described above, are formed in the dielectric layer 116 to expose the top surfaces of the vias 112. In some embodiments, the trench openings 140 have a height less than or equal to 80 nm, such as in a range from 30 nm to 80 nm.

FIG. 17 illustrates a structure after subsequent processing on the structure of FIG. 16. The processing steps between FIGS. 16 and 17 are similar to those illustrated and described above in FIGS. 8 through 12 and the description is not repeated herein.

In some embodiments, the processes to form the conductive vias 112 could be applied to the formation of the conductive lines 128 such that all (or as many as desired) of the conductive features in the interconnect structure could be formed utilizing the processes described above for the conductive vias 112.

Embodiments may achieve advantages. Conductive features, such as conductive vias, conductive lines, and metallization layers in an interconnect structure, and methods of forming the same are provided, according to some embodiments. In particular, the conductive vias are formed using a separate pattern and conductive material formation process from the conductive lines. The separate pattern allows for a wider gap fill window for the conductive vias and also allows for the conductive vias to be formed without a barrier layer on the bottom surfaces of the conductive vias. Therefore, the separate pattern and formation process allows for improved metal gap filling and lower contact resistance for the conductive vias. In some embodiments, the contact resistance is lowered by 50% or more over conventionally formed conductive vias. Further, the disclosed process does not require an etch stop layer, which can improve the integrity of the barrier layer as it is not deposited on the sidewall of the etch stop layer in the via and/or line opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an opening in a mask layer, the opening exposing a conductive feature below the mask layer;
   forming a conductive material in the opening using an electroless deposition process, the conductive material forming a conductive via;
   removing the mask layer;
   forming a conformal barrier layer on a top surface and sidewalls of the conductive via;
   forming a dielectric layer over the conformal barrier layer and the conductive via;
   removing the conformal barrier layer from the top surface of the conductive via; and
   forming a conductive line over and electrically coupled to the conductive via, wherein forming the conductive line comprises:
      forming a second opening in the dielectric layer, wherein forming the second opening removes the conformal barrier layer from the top surface of the conductive via.

2. The method of claim 1, wherein the conductive line physically contacts top surfaces of the conductive via and the conformal barrier layer.

3. The method of claim 1, wherein forming the conformal barrier layer comprises:
   performing an atomic layer deposition process, the atomic layer deposition process forming the conformal barrier layer.

4. The method of claim 1, wherein the conformal barrier layer is not between the conductive via and the conductive feature.

5. The method of claim 1, wherein forming the conductive line further comprises:
   forming a second barrier layer in the second opening;
   forming a seed layer on the second barrier layer; and
   forming a second conductive material on the seed layer in the second opening.

6. The method of claim 1 further comprising:
   planarizing the dielectric layer, the conformal barrier layer, and the conductive via to expose the top surface of the conductive via, wherein planarizing the dielectric layer removes the conformal barrier layer from the top surface of the conductive via;
   forming a second dielectric layer over the planarized dielectric layer, the planarized conformal barrier layer, and the planarized conductive via;
   forming a second opening in the second dielectric layer, the top surface of the conductive via being exposed in the second opening; and
   forming the conductive line in the second opening.

7. The method of claim 1, wherein the conductive material of the conductive via comprises copper.

8. The method of claim 1, wherein forming the conductive material in the opening using an electroless deposition process further comprises:
   performing a first electroless deposition process to form a first conductive material in the opening, the first conductive material partially filling the opening; and
   performing a second electroless deposition process to form a second conductive material on the first conductive material in the opening, the first conductive material being different than the second conductive material.

9. The method of claim 8, wherein the first conductive material is copper, and the second conductive material is cobalt.

10. A method comprising:
    forming a first device on a substrate, the first device comprising a gate electrode on the substrate with source/drain regions on opposite sides of the gate electrode;
    forming a first dielectric layer over the first device and the substrate;
    forming conductive contacts in the first dielectric layer and electrically coupled to the gate electrode and source/drain regions of the first device;
    forming a photoresist over the first dielectric layer and the conductive contacts;

forming first openings within the photoresist, the conductive contacts being exposed in the first openings;

performing an electroless deposition process forming a conductive material in the first openings, the conductive material in the first openings forming conductive vias in the first openings, wherein performing the electroless deposition process forming the conductive material in the first openings further comprises:

performing a first electroless deposition process to form a first conductive material in the first opening, the first conductive material partially filling the first openings; and performing a second electroless deposition process to form a second conductive material on the first conductive material in the first opening, the first conductive material being different than the second conductive material;

removing the photoresist;

conformally depositing a barrier layer on top surfaces and sidewalls of conductive vias;

forming a second dielectric layer over the conductive vias;

removing a portion of the barrier layer to expose top surfaces of the conductive vias; and forming conductive lines over and coupled to the top surfaces of the conductive vias.

11. The method of claim 10, wherein the barrier layer extends from the first dielectric layer to the conductive lines.

12. The method of claim 11, wherein the barrier layer is not between the conductive contacts and the conductive vias.

13. The method of claim 10, wherein the first conductive material is copper, and the second conductive material is cobalt.

14. The method of claim 10, wherein forming the conductive lines comprises:

forming second openings in the second dielectric layer, wherein forming the second openings removes the barrier layer to expose top surfaces of the conductive vias;

forming a second barrier layer in the second openings;

forming a seed layer on the second barrier layer; and forming a second conductive material on the seed layer in the second openings.

15. The method of claim 10 further comprising:

planarizing the second dielectric layer, the barrier layer, and the conductive vias to expose the top surfaces of the conductive vias, wherein planarizing the second dielectric layer removes the barrier layer to expose top surfaces of the conductive vias;

forming a third dielectric layer over the planarized second dielectric layer, the planarized barrier layer, and the planarized conductive vias;

forming second openings in the third dielectric layer, the top surfaces of the conductive vias being exposed in the second openings; and forming the conductive lines in the second openings.

16. The method of claim 10, wherein the conductive contacts taper from a top surface to a bottom surface, and wherein the conductive vias have a same width from a top surface to a bottom surface.

17. A structure comprising:

a conductive feature on a substrate;

a first dielectric layer over the conductive feature and the substrate;

a conductive via extending through the first dielectric layer and electrically and physically contacting the conductive feature, wherein the conductive via comprises a cobalt layer over a copper layer;

a barrier layer being along sidewalls of the conductive via and a bottom surface of the first dielectric layer, the barrier layer being a conformal layer, the barrier layer, conductive via, and first dielectric layer having coplanar top surfaces;

a second dielectric layer over the first dielectric layer, the conductive via, and the barrier layer; and a conductive line extending through the second dielectric layer and electrically and physically contacting the conductive via.

18. The structure of claim 17 further comprising:

a first device on the substrate, the first device comprising a gate electrode on the substrate with source/drain regions on opposing sides of the gate electrode;

a third dielectric layer over the first device and the substrate, the first dielectric layer being over the third dielectric layer; and conductive contacts in the third dielectric layer and electrically coupled to the gate electrode and source/drain regions of the first device, the conductive features being one of the conductive contacts.

19. The structure of claim 17, wherein the barrier layer extends from the first dielectric layer to the conductive line.

20. The structure of claim 17, wherein the barrier layer is not between the conductive feature and the conductive via.

* * * * *